United States Patent [19]

Paolella

[11] Patent Number: 4,861,426

[45] Date of Patent: Aug. 29, 1989

[54] METHOD OF MAKING A MILLIMETER WAVE MONOLITHIC INTEGRATED CIRCUIT

[75] Inventor: Arthur Paolella, Howell, N.J.

[73] Assignee: The United States of America as represented by the Secretary of the Army, Washington, D.C.

[21] Appl. No.: 300,508

[22] Filed: Jan. 23, 1989

[51] Int. Cl.⁴ ............... H01L 21/306; B44C 1/22; C03C 15/00; C03C 25/06
[52] U.S. Cl. .................... 156/644; 156/653; 156/659.1; 156/657; 156/662; 357/40; 357/65; 357/81; 437/203; 437/228; 437/241; 437/902

[58] Field of Search .............. 156/644, 653, 659.1, 156/657, 661.1, 662; 437/2, 3, 7, 9, 61, 203, 228, 241, 902; 357/17, 26, 29–32, 40, 55, 65, 81

[56] References Cited

U.S. PATENT DOCUMENTS 4,675,525 6/1987 Amingual et al. ................ 437/3 X

Primary Examiner—William A. Powell
Attorney, Agent, or Firm—Michael J. Zelenka; Roy E. Gordon

[57] ABSTRACT

A method is provided of making a millimeter wave monolithic integrated circuit that allows for device isolation during epitaxial growth and integral heat sink with supporting circuitry on the substrate.

3 Claims, 1 Drawing Sheet

METHOD OF MAKING A MILLIMETER WAVE MONOLITHIC INTEGRATED CIRCUIT

The invention described herein be manufactured, used, and licensed by or for the Government for governmental purposes without the payment to me of any royalty thereon.

This invention relates in general to a method of making a millimeter wave monolithic integrated circuit and in particular, to such a method that allows for device isolation during epitaxial growth and integral heat sink with supporting circuitry on the substrate.

BACKGROUND OF THE INVENTION

Heretofore, monolithic circuits as for example, gallium arsenide monolithic circuits have been made on semi-insulating semiconductor surfaces. The difficulty of this construction has been the poor thermal conductivity of the semi-insulating material especially at millimeter wave frequencies.

SUMMARY OF THE INVENTION

The general object of this invention is to provide a method of making a millimeter monolithic integrated circuit. A more specific object of the invention is to provide such a method that allows for device isolation during epitaxial growth and integral heat sink for low thermal resistance. A still further object of the invention is to provide such a method that will result in circuits that can be used as oscillators and amplifiers in the microwave and millimeter wave frequency region.

It has now been found that the aforementioned objects can be attained by a method of making a millimeter wave monolithic integrated circuit from a semi-insulating substrate material including the steps of:

(A) depositing a thin passivation layer of silicon nitride on the top surface of the semi-insulating substrate material, (B) depositing a layer of photoresist over the silicon nitride layer, (C) placing a mask on top of the photoresist layer wherein the mask bears a pattern of a millimeter wave monolithic device and exposing the mask to ultraviolet light, (D) removing the mask and placing the substrate in an etching solution causing unexposed photoresist to be etched away and exposing the semi-insulating substrate material in the desired pattern of the millimeter wave monolithic device, (E) making the millimeter wave monolithic device by epitaxially growing layers on the semi-insulating substrate material so that under the exposed semi-insulating substrate material there will be single crystal growth that will make up the millimeter wave monolithic device and where there was silicon nitride, there will be an amorphous crystal that will act as an insulator, isolating each millimeter wave device, (F) electroplating a gold heat sink over the entire structure, (G) turning the entire structure upside down and depositing photoresist onto the semi-insulating substrate material, (H) placing a mask on top of the photoresist layer wherein the mask bears a pattern of the millimeter wave monolithic device and exposing the mask to ultraviolet light, (I) removing the mask and placing the substrate in an etching solution causing unexposed photoresist to be etched away and exposing the semi-insulating substrate material in the desired pattern, (J) placing the semi-insulating substrate material in a solution that will etch a hole in the semi-insulating substrate material that has been exposed, (K) filling the hole that was made in the semi-insulating substrate material with gold to make contact to the millimeter wave monolithic integrated circuit, (L) depositing photo-resist onto the semi-insulating substrate, (M) placing a mask on top of the photo-resist layer wherein the mask bears the pattern of the millimeter wave monolithic circuit and exposing to UV, (N) removing the mask and placing solution and exposing the substrate in the desired pattern, (O) electroplating gold over the entire substrate and etching off the photo-resist, and (P) lifting off the gold which was under the photo-resist leaving behind the desired circuit pattern.

As the semi-insulating substrate material, the use of gallium arsenide is preferred. The gallium arsenide substrate is about 1 to 3 inches in diameter and about 8 mils in thickness. It is first processed to have a clean surface as is well known in the art.

DESCRIPTION OF THE DRAWING

Referring to FIGS. 1a to 1h; FIG. 1a shows the semi-insulating substrate material, 10, for example, GaAs. A thin passivation layer, 12, of $Si_3N_4$ is placed over the top surface as seen in FIG. 1b. Next, a photolithography process is used to delineate a hole, 14, where the device will be made. Photoresist, 16, coats the substrate and a mask, 18, placed on top is exposed to ultraviolet light, 15, as seen in FIG. 1c. Chemical etching removes the passivation exposing the substrate, 10, as seen in FIG. 1d. The wafer is then placed in a molecular beam epitaxy reactor, and the proper impurity concentration are grown. On the exposed surface, the device is made, on the area covered with the passivation, 12, amorphous crystal, 22, are grown as seen in FIG. 1e. A series of devices are now isolated (not shown). The substrate, 10, is removed from the chamber. The substrate, 10, is placed in an electroplating solution and gold is electroplated on the epitaxial side to form an integral heat sink, 24, as seen in FIG. 1f. The entire structure is turned upside down and a second photolithography opens a via hole, 26, below the device area (via hole) and metal deposited to make a contact, 28, as seen in FIG. 1g. A third photolithography process is used to make the circuit 30 on the substrate side as seen in FIG. 1h. The circuit lines are then plated to a thickness needed to support current.

Figure 1A:
FIGS. 1a–1h is a description of the processing steps used to produce a millimeter wave monolithic integrated circuit according to the invention.
Figure 1B:
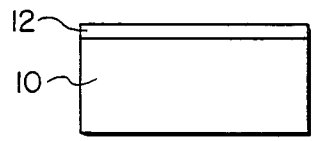
Figure 1C:
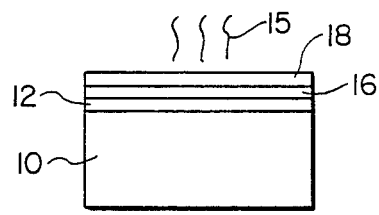
Figure 1D:
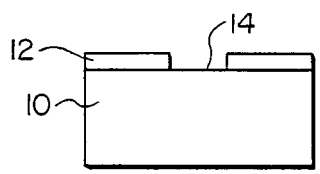
Figure 1E:
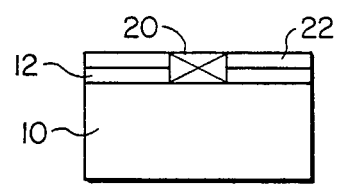
Figure 1F:
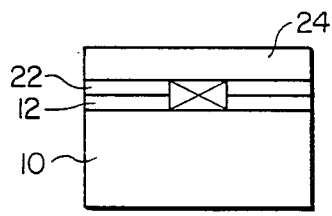
Figure 1G:
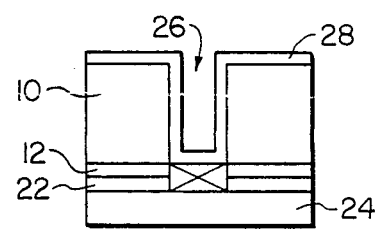
Figure 1H:
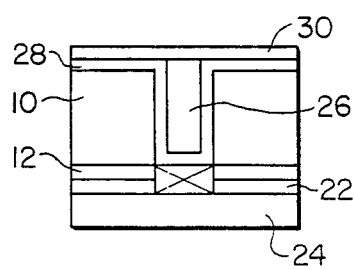

I wish it to be understood that I do not desire to be limited to the exact details as described for obvious modifications will occur to a person skilled in the art.

What is claimed is:

1. Method of making a millimeter wave monolithic integrated circuit from a semi-insulating substrate material, said method including the steps of:

(A) depositing a thin passivation layer of silicon nitride on the top surface of the semi-insulating substrate material, (B) depositing a layer of photoresist over the silicon nitride layer,
(C) placing a mask on top of the photoresist layer wherein the mask bears a pattern of the millimeter wave monolithic device and exposing the mask to ultraviolet light,
(D) removing the mask and placing the millimeter wave monolithic integrated circuit in an etching solution causing unexposed photoresist to be etched away and exposing the semi-insulating substrate material in the desired pattern,
(E) making the millimeter wave monolithic device by epitaxially growing layers of semi-insulating substrate material so that under the exposed semi-insulating substrate material there will be single crystal growth that will make up the millimeter wave monolithic device and where there was silicon nitride, there will be an amorphous crystal that will act as an insulator, isolating each millimeter wave monolithic device,
(F) electroplating a gold heat sink over the entire structure,
(G) turning the entire structure upside down and depositing photoresist onto the semi-insulating substrate material,
(H) placing a mask on top of the photoresist layer wherein the mask bears a pattern of the millimeter wave monolithic device and exposing the mask to ultraviolet light,
(I) removing the mask and placing the substrate in an etching solution causing unexposed photoresist to be etched away and exposing the semi-insulating substrate material in the desired pattern,
(J) placing the semi-insulating substrate material in a solution that will etch a hole in the semi-insulating substrate material that has been exposed,
(K) filling the hole that was made in the semi-insulating substrate material with gold to make contact to the millimeter wave monolithic integrated circuit.
(L) depositing photo-resist onto the semi-insulating substrate,
(M) placing a mask on top of the photo-resist layer wherein the mask bears the pattern of the millimeter wave monolithic circuit and exposing to UV,
(N) removing the mask and placing the substrate in an etching solution and exposing the substrate in the desired pattern,
(O) electroplating gold over the entire substrate and etching off the photo-resist, and
(P) lifting off the gold which was under the photo-resist leaving behind the desired circuit pattern.

2. Method according to claim 1 wherein the semi-insulating substrate material is GaAs.

3. Method according to claim 2 wherein the GaAs material is about 1 to 3 inches in diameter and about 8 mils in thickness.

* * * * *